United States Patent
Willer et al.

(10) Patent No.: US 6,627,498 B2
(45) Date of Patent: Sep. 30, 2003

(54) MEMORY CELL FABRICATION METHOD AND MEMORY CELL CONFIGURATION

(75) Inventors: Josef Willer, Riemerling (DE); Veronika Polei, Bad Schandau (DE)

(73) Assignee: Infineon Technologies AG, Munich (DE)

( * ) Notice: Subject to any disclaimer, the term of this patent is extended or adjusted under 35 U.S.C. 154(b) by 13 days.

(21) Appl. No.: 10/093,722

(22) Filed: Mar. 8, 2002

(65) Prior Publication Data

US 2003/0148582 A1 Aug. 7, 2003

(30) Foreign Application Priority Data

Feb. 7, 2002 (DE) .......................................... 102 05 079

(51) Int. Cl.$^7$ .......................................... H01L 21/8247
(52) U.S. Cl. ...................................... 438/257; 438/594
(58) Field of Search ................................. 438/257–267, 438/593–594

(56) References Cited

U.S. PATENT DOCUMENTS

| | | | |
|---|---|---|---|
| 5,120,672 A | | 6/1992 | Mitchell et al. |
| 5,324,675 A | | 6/1994 | Hayabuchi |
| 5,496,753 A | | 3/1996 | Sakurai et al. |
| 5,830,771 A | * | 11/1998 | Fukatsu et al. ............. 438/257 |
| 5,989,957 A | | 11/1999 | Ngo et al. |
| 6,238,978 B1 | * | 5/2001 | Huster ......................... 439/264 |
| 6,255,165 B1 | * | 7/2001 | Thurgate et al. ............ 438/257 |
| 6,410,957 B1 | * | 6/2002 | Hsieh et al. ................. 257/321 |
| 6,440,789 B1 | * | 8/2002 | Hamilton et al. ........... 438/232 |
| 6,486,030 B2 | * | 11/2002 | Gonzalez et al. ........... 438/261 |

FOREIGN PATENT DOCUMENTS

EP 1 170 800 A2 1/2002

* cited by examiner

Primary Examiner—Richard Booth
(74) Attorney, Agent, or Firm—Laurence A. Greenberg; Werner H. Stemer; Ralph E. Locher

(57) ABSTRACT

The memory cell has a source region and a drain region in semiconductor material and, above a channel region between the source and drain regions, a three-layered layer structure with a storage layer between boundary layers and a gate electrode arranged thereon. The storage layer is replaced above the channel region by an etching layer made of $Al_2O_3$. During fabrication, the etching layer is etched out laterally and the second boundary layer is thus undercut. The resulting interspaces are filled with the material of the storage layer. The provision of suitable spacers makes it possible to define the dimensions of the memory cell.

6 Claims, 4 Drawing Sheets

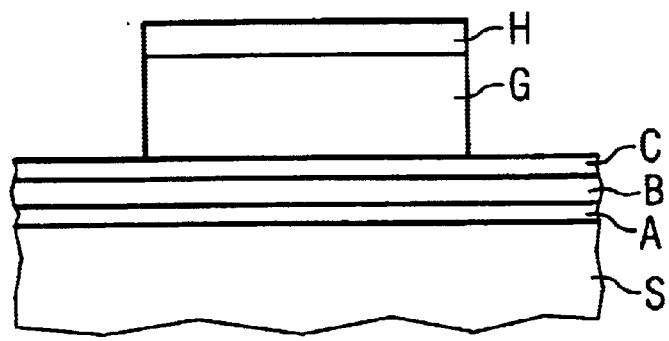
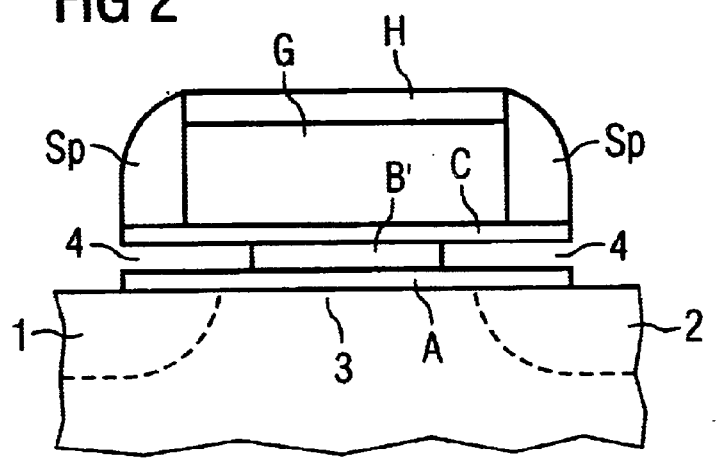
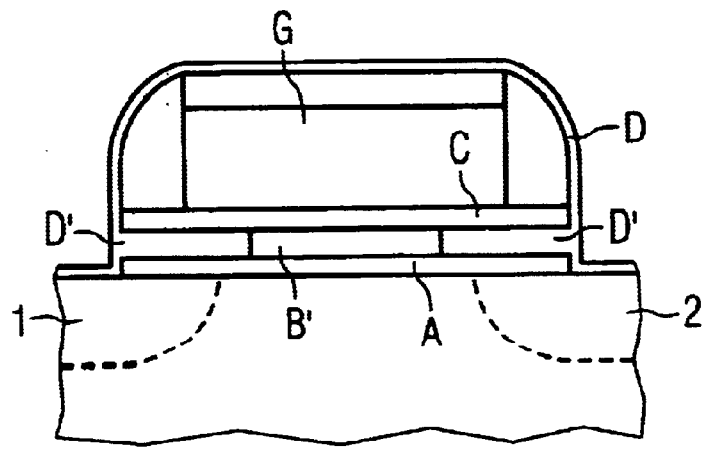

MEMORY CELL FABRICATION METHOD AND MEMORY CELL CONFIGURATION

BACKGROUND OF THE INVENTION

Field of the Invention

The present invention relates to a method for the fabrication of a memory cell of an EEPROM and to a construction of such a memory cell.

One of the most important development goals in semiconductor memory technology is to embody ever smaller memory cells, i.e. to use ever smaller silicon areas per stored information unit (bit). The problem arises thereby that, on the one hand, the spatial extent of the charge trapped in a dielectric storage layer, which is approximately 40 nm, becomes larger and larger relative to the decreasing effective channel length of the memory transistor and, on the other hand, as the number of write and erase cycles increases, the stored charge tends to diffuse apart. Moreover, it is advantageous for the miniaturization sought if it is possible to reduce the required source-drain voltage for the operation of the memory cell. This voltage, at least in the case of programming by CHE (Channel Hot Electron), is largely predetermined by material-specific properties such as the electrical barrier height. It is approximately 3.1 eV for the customary layer combination of $SiO_2/Si_3N_4/SiO_2$. A reduction through suitable new layer combinations is therefore sought.

A memory cell of the kind described below is suitable for stand-alone applications and for so-called embedded applications. Memory cells having a dielectric adhesion layer as storage layer are known per se. The memory cell according to the invention as described below also has a layer construction which comprises a dielectric adhesion layer as storage layer. Such memory cells can be used e.g. in a virtual ground NOR architecture, known per se, or in a common ground NOR architecture. They can be programmed e.g. by channel hot electrons and erased by hot holes.

SUMMARY OF THE INVENTION

It is accordingly an object of the invention to provide a fabrication method and an EEPROM memory cell configuration, which overcome the above-mentioned disadvantages of the heretofore-known devices and methods of this general type and which specifies a method for the fabrication and a construction of a memory cell which enable further miniaturization of the memories.

With the foregoing and other objects in view there is provided, in accordance with the invention, a method of fabricating a memory cell of an EEPROM. The method comprises:

forming a source region and a drain region, with a channel region therebetween, in semiconductor material; and applying a three-layered layer structure with a storage layer between boundary layers and a gate electrode above the channel region, by performing the following steps:

in a first step, applying on a top side of a semiconductor material (body or semiconductor layer) a first boundary layer, an etching layer, a second boundary layer, and a gate electrode, whereby a material of the etching layer is selectively etchable with respect to a material of the first boundary layer and a material of the second boundary layer;

in a second step, removing at least the second boundary layer and the etching layer outside a region provided for the memory cell;

in a third step, selectively removing portions of the etching layer by a laterally effected etching attack under the second boundary layer, to form of the etching layer a residual portion above the channel region between the source region and the drain region;

in a fourth step, filling at least those regions below the second boundary layer wherein the material of the etching layer was removed with a material for a storage layer; and subsequently processing further method steps for electrically connecting the resulting memory cell.

In accordance with an added feature of the invention, the second step comprises fabricating spacer elements on the two sides of the gate electrode facing the source region and the drain region, respectively, the spacer elements defining a projected lateral extent of the three-layered layer structure, and removing the second boundary layer, the etching layer, and the first boundary layer outside a region covered by the gate electrode and the spacer elements.

In accordance with an alternative feature of the invention, the second step comprises fabricating spacer elements on the two sides of the gate electrode facing the source region and the drain region, respectively, the spacer elements defining a projected lateral extent of the second boundary layer, and removing the second boundary layer and the etching layer outside a region covered by the gate electrode and the spacer elements.

In accordance with a further feature of the invention, the second step comprises removing the second boundary layer and the etching layer outside a region covered by the gate electrode, and between the fourth and fifth steps, fabricating spacer elements on the two sides of the gate electrode facing the source region and the drain region, respectively.

In accordance with an added feature of the invention, the first boundary layer is fabricated from $SiO_2$, zirconium silicate, or hafnium silicate, the etching layer comprises $Al_2O_3$, and the second boundary layer is fabricated from $SiO_2$, zirconium silicate, or hafnium silicate.

In accordance with a concomitant feature of the invention, the boundary layers is fabricated from zirconium silicate or hafnium silicate with an atomic layer deposition process (ALD).

With the above and other objects in view there is also provided, in accordance with the invention, a memory cell of an EEPROM, comprising:

a semiconductor material having a source region and a drain region formed therein;

a channel region between the source region and the drain region;

a three-layered layer structure formed above the channel region and a gate electrode above the layer structure, the layer structure having boundary layers and a storage layer between the boundary layer; and an interruption of the storage layer above the channel region formed of a region of $Al_2O_3$ between the boundary layers.

In other words, the memory cell comprises a source region and a drain region in semiconductor material and, above a channel region provided between the source and drain regions, a three-layered layer structure with a storage layer between boundary layers and a gate electrode arranged thereon, the storage layer being interrupt ed above the channel region and replaced by an etching layer made, preferably, of $Al_2O_3$. During the fabrication, a three-layered layer structure comprising a first boundary layer, which is preferably silicon dioxide, an etching layer, which is preferably $Al_2O_3$, and a second boundary layer, which is preferably likewise $SiO_2$, is applied. In preferred embodiments, the boundary layers may alternatively be zirconium silicate or hafnium silicate.

The middle layer is etched out laterally in each case proceeding from the regions of the source and drain, so that the second boundary layer is undercut. The interspaces produced in this way are filled with the material provided for the storage layer, preferably silicon nitride. The provision of suitable spacer elements makes it possible to define the dimensions of the memory cell in an envisaged manner.

Other features which are considered as characteristic for the invention are set forth in the appended claims.

Although the invention is illustrated and described herein as embodied in a method for the fabrication and construction of a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Specific examples of the fabrication method and preferred configurations of the memory cell are described in more detail below with reference to FIGS. 1–5, 2a, 2b and 1a to 3b.

BRIEF DESCRIPTION OF THE DRAWINGS

FIGS. 1 to 5 are cross sectional views of intermediate products of a preferred fabrication method;

DESCRIPTION OF THE PREFERRED EMBODIMENTS

Figure 1B:
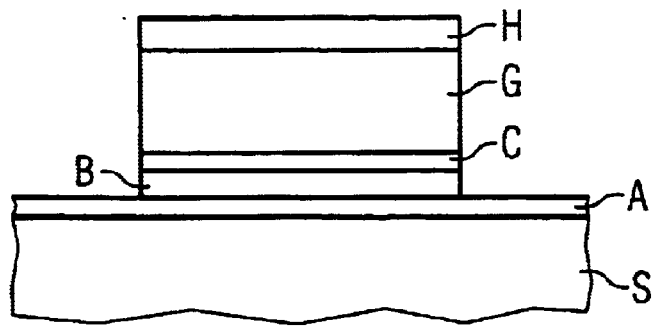
FIGS. 1b, 2b and 3b show alternatives to FIGS. 1, 2 and 3, respectively.
Figure 3B:
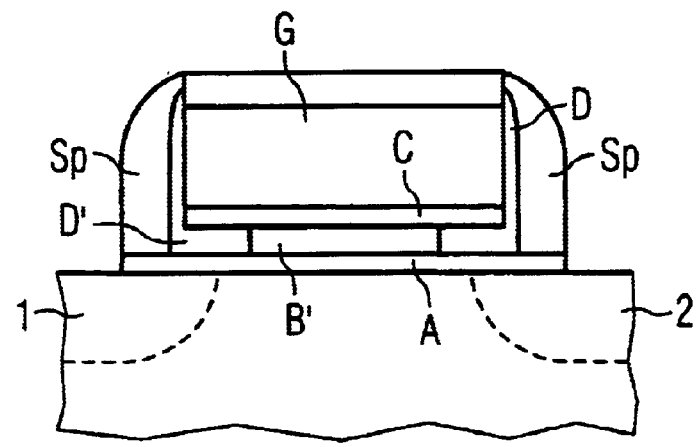

Referring now to the figures of the drawing in detail and first, particularly, to the primary embodiments in FIGS. 1–5 thereof, the preferred embodiments of the method will be described with reference to the figures and preferred exemplary embodiments of the completed memory cell also emerge from the figures. The fabrication process begins with customary method steps, e.g. of CMOS technology. Firstly, the active region is isolated by STI (Shallow Trench Isolation). A pad oxide layer is grown and a pad nitride layer is deposited. The trenches provided for the STI are etched by means of a photomask technique, and the trenches are subsequently filled with oxides. Suitable measures for planarization, such as e.g. CMP (Chemical Mechanical Polishing), follow. The pad nitride is etched, and the p-type wells and n-type wells required for the CMOS components are formed by the introduction of dopant. The doped regions required for the fabrication of the memory cells, with the exception of the source regions and drain regions, are also fabricated in this step. This is done as usual by a masked implantation of boron and phosphorus and subsequent annealing of the dopings. This concludes a pretreatment—known per se—of the semiconductor wafer.

In order to fabricate the memory cells, firstly the screen oxide (pad oxide layer) is then removed. A three-layered layer structure according to the invention is firstly deposited over the entire area. FIG. 1 illustrates in cross section a substrate S (a semiconductor body or a substrate with a semiconductor layer sequence applied thereon) to which the layers described below are applied. Firstly, a layer provided as a first boundary layer A is deposited, preferably to a thickness equivalent to an oxide layer of about 5 nm. This layer may be e.g. a thermally produced $SiO_2$, zirconium silicate or hafnium silicate. A zirconium silicate layer or a hafnium silicate layer is in this case preferably fabricated by means of ALD (Atomic Layer Deposition).

On the latter, a layer provided as etching layer B is likewise deposited over the whole area, preferably comprising $Al_2O_3$ and preferably likewise by means of ALD. The latter is followed by a second boundary layer C having a thickness equivalent to an oxide layer of about 10 nm, this second boundary layer C preferably being fabricated from the same material as the first boundary layer A. In this case, then, the second boundary layer C is likewise $SiO_2$, zirconium silicate preferably applied by means of ALD or hafnium silicate preferably applied by means of ALD.

Once these layers have initially been applied over the whole area, the layers are removed in a region of the substrate that is provided for CMOS components, by means of a mask technique, for which purpose HF (hydrofluoric acid) can be used. If the am dielectric properties of this three-layered structure do not suffice for a function as gate dielectric, there is preferably grown specially a separate gate oxide or else a plurality of gate oxides one after the other, whereby the properties of the three-layered layer structure are possibly influenced, which must be taken into account accordingly, if appropriate, in the dimensioning of the layers.

Polysilicon is then preferably deposited, as gate electrode G, to a thickness of 80 nm and a nitride layer is applied thereon to a thickness of about 50 nm. Using a photomask technique, the nitride layer is patterned to form a hard mask H which, after the removal of the photoresist mask, is used as a mask for patterning the gate electrode G.

Firstly, the gate electrodes are patterned for rows of memory cells along an envisaged bit line as strips. The etching of the polysilicon ends on the second boundary layer C. The intermediate product illustrated in section in FIG. 1 is thus fabricated.

One possible alternative is illustrated in section in FIG. 1b. There, the etching (preferably a dry etching) is continued down as far as the first boundary layer A. If the etching layer B is $Al_2O_3$, this material can be removed, for example by using chlorine-containing or bromine-containing gases.

In accordance with the first-described variant of FIGS. 1 to 3, a spacer layer is then applied, which is preferably an oxide having a thickness of 40 nm. The spacer elements Sp (FIG. 2) are fabricated from the layer in a conventional way by anisotropically etching the layer, which is initially present with a uniform thickness. Using the gate electrode with the spacer elements fabricated on both sides, dopant is then introduced for the regions of source 1 and drain 2. If the semiconductor material or a well formed in the semiconductor material is firstly doped in p-conducting fashion, an $n^+$-type bit line implantation is effected in this case, e.g. by introducing arsenic. As a result, a region provided as channel region 3 is present between the source region 1 and the drain region 2.

The three-layered layer structure is then removed laterally with respect to the spacer elements Sp, which can be done e.g. by means of RIE (Reactive Ion Etching). The etching layer B is then laterally etched selectively with respect to the boundary layers A, C, preferably wet-chemically, and thus etched out as far as a depth below the second boundary layer C which can be determined by way of the etching rate. If the boundary layers are $SiO_2$ and the etching layer is $Al_2O_3$, the $Al_2O_3$ can still be etched selectively with respect to the oxide of the boundary layers after a thermal treatment of just above 800° C. using $H_3PO_4$ (phosphoric acid). The etching rate depends to a great extent on the respective thermal treatment of the $Al_2O_3$. For the process control envisaged here, it is possible to set a typical etching rate of approximately 5 nm per minute. The result of this method step is illustrated in section in FIG. 2. Here the etched-out regions 4 can be discerned, whereas all that remains of the etching layer is the residual portion B'.

Figure 2B:
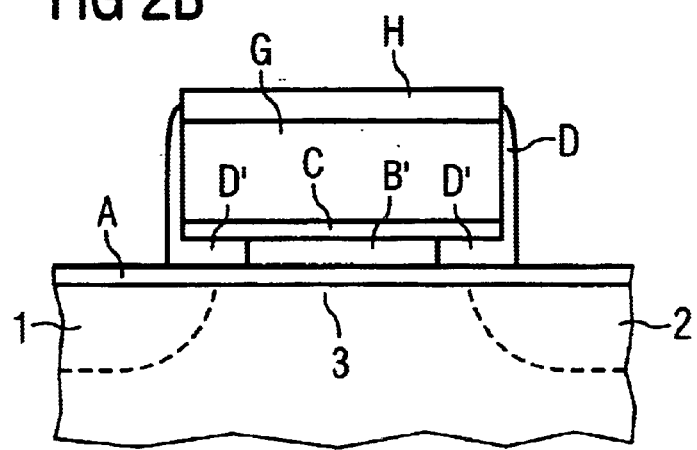
Figure 2A:
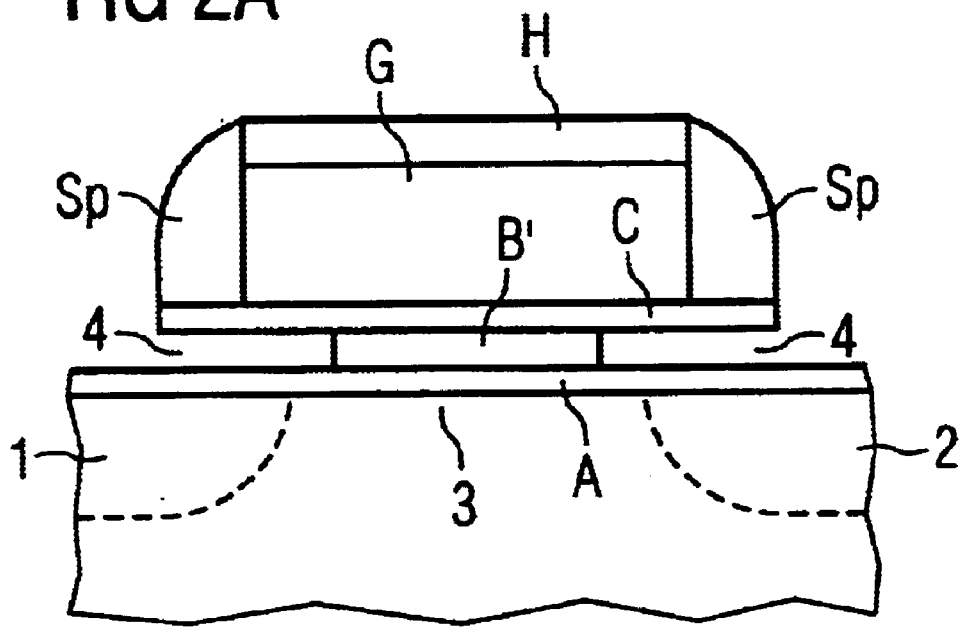
FIGS. 2a and 3a are alternative embodiments to those of FIGS. 2 and 3.

FIG. 2a illustrates an alternative wherein, in accordance with the cross section of FIG. 1b, the first boundary layer A is initially still present over the whole area in the region provided for the memory cells.

Afterward, the material provided for the storage layer is deposited onto the structure illustrated in FIG. 2, thereby producing the structure illustrated in section in FIG. 3. In this case, the material D of the layer is present on the top side with an approximately uniform thickness, while respective portions between the first boundary layer A and the second boundary layer C fill the previously etched-out regions of the etching layer. These portions of the material D present between the boundary layers form the storage layer D'. The storage layer D' is preferably nitride ($Si_3N_4$), and the material D is preferably deposited by LPCVD (Low Pressure Chemical Vapor Deposition).

The fabrication process is continued with a view to the planned application of the memory cell. Since the remaining method steps correspond to the method steps known per se for the fabrication of a semiconductor memory, as an example only one possible configuration is described in more detail here with reference to FIGS. 4 and 5 in order to complete the description. This example yields a memory cell provided for a virtual ground NOR architecture. To that end, the material D is firstly removed in the region between the memory cells of a memory cell arrangement, i.e. above the source regions and drain regions. A nitride is e.g. etched, with the result that, depending on the etching time, if appropriate, a spacer D (see FIG. 4) remains on the sidewalls of the gate electrodes. Metal for a self-aligned siliconization is then deposited onto the semiconductor material, preferably titanium or cobalt. The siliconization is initiated by a heat treatment step. The unsiliconized metal is subsequently removed. The metal provided for the bit line 5 is deposited between the gate electrodes of adjacent memory cells. Afterward, an oxide is deposited, e.g. TEOS, and planarized, e.g. using RIE. The nitride of the hard mask is preferably removed wet-chemically (e.g. using hot phosphoric acid).

Figure 5:
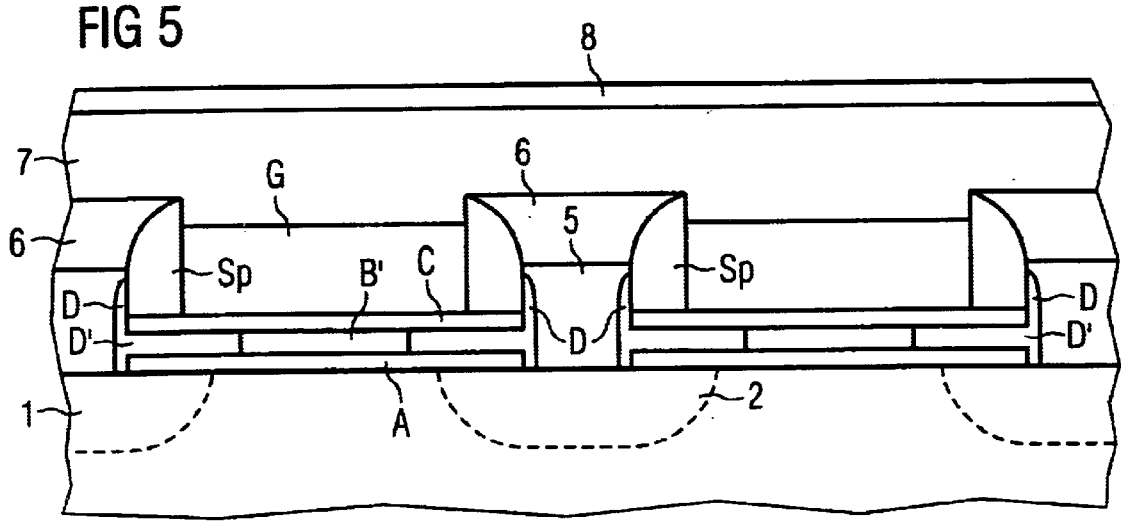

As is illustrated in section in FIG. 5, after the planarization and the removal of the hard mask, a respective oxide layer 6 is present on the bit lines 5, and the top sides of the gate electrodes G are uncovered. A layer or layer sequence is deposited thereon and patterned as word line. This layer sequence is e.g. a polysilicon layer 7 and a metal 8, preferably WSi, deposited thereon. The word lines can be patterned, once again using a hard mask, e.g. made of nitride. The hard mask is patterned in a customary manner using a photomask technique.

In addition, further method steps are carried out, which are known per se and by which the individual components of the memory cells and of the drive periphery are electrically connected. During the patterning of the word lines, the gate electrodes G are also removed in regions parallel to the word lines, i.e. in front of and behind the plane of the drawing in FIG. 5, with the result that the individual memory cells are isolated from one another in the direction of the bit lines 5 as well. The polysilicon can be etched with high selectivity with respect to the oxide of the second boundary layer C. It is also possible to introduce an anti-punch implantation between the word lines, possibly using a photomask technique. Still further steps for constructing the transistors follow, such as: gate reoxidation, fabrication of nitride spacers and/or oxide spacers, LDD implantations and HDD implantations and deposition of nitride as passivation and also of BPSG (borophosphorous silicate glass) and subsequent planarization by CMP. The fabrication and filling of the contact holes and of the metalization for wiring and also the application of the remaining passivation can be performed in a known manner.

Figure 3A:
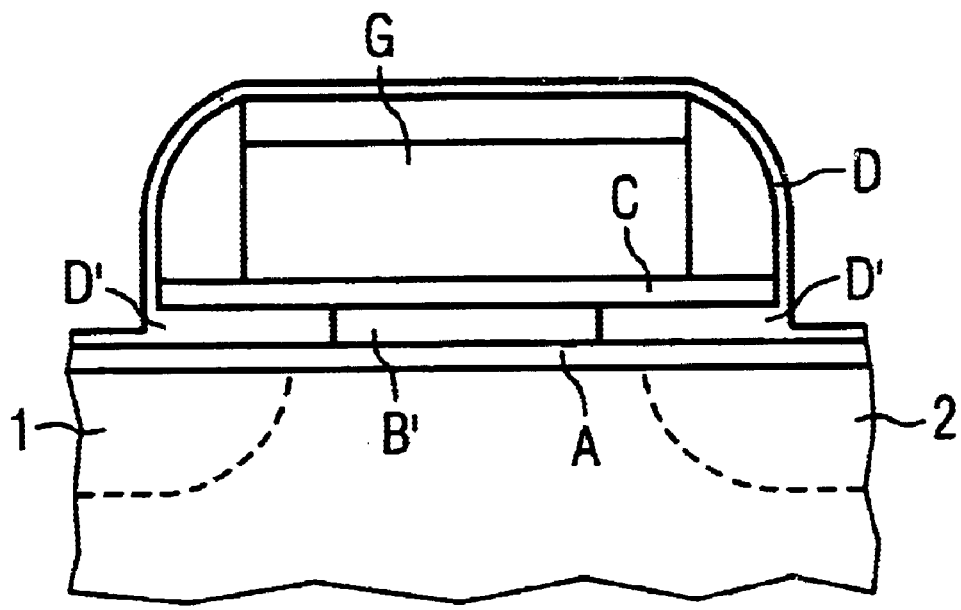
Figure 4:
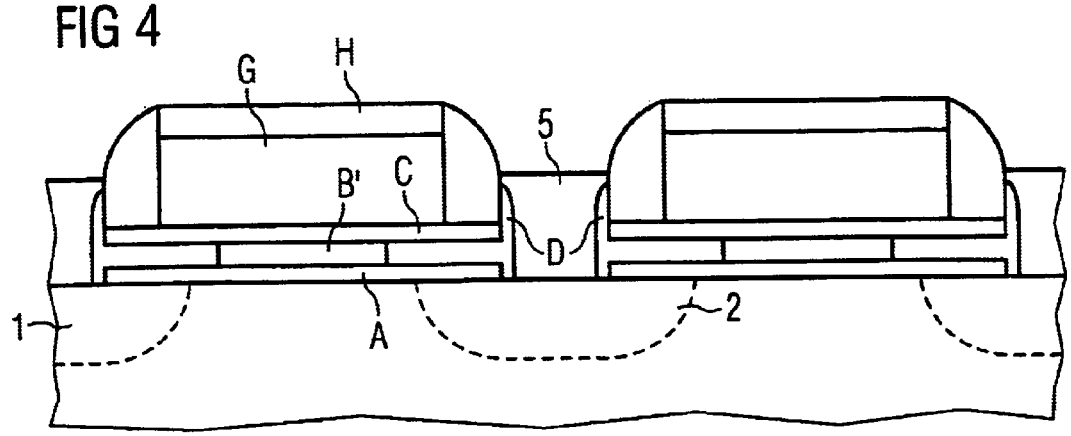

If, in accordance with FIG. 2a, the first boundary layer A is not etched back to the region occupied by the gate electrode and the spacer elements Sp, a somewhat modified construction results in accordance with FIG. 3a after the application of the material D provided for the storage layer. The first boundary layer A can be removed laterally with respect to the memory cell in a subsequent method step, preferably after the etching-back of the material D of the storage layer.

Proceeding from the structure illustrated in cross section in FIG. 1b, it is also possible, as early as before the fabrication of the spacer elements, to etch out the etching layer B laterally and to apply the material D provided for the storage layer D'. In accordance with the cross section of FIG. 2b, said material D is preferably etched back anisotropically, so that all that remain are the storage layer D' and at most narrow spacers on the side walls of the gate electrode. Only then, in this variant of the fabrication method, is the layer provided for the spacer elements firstly deposited over the whole area and then etched back anisotropically in order to go form the spacer elements Sp illustrated in cross section in FIG. 3b. The remaining method steps described can then follow in an identical manner, in principle.

We claim:

1. A method of fabricating an EEPROM memory cell, which comprises:

forming a source region and a drain region, with a channel region therebetween, in semiconductor material; and applying a three-layered layer structure with a storage layer between boundary layers and a gate electrode above the channel region, by performing the following steps:

in a first step, applying on a top side of a semiconductor material a first boundary layer, an etching layer, a second boundary layer, and a gate electrode, whereby a material of the etching layer is selectively etchable with respect to a material of the first boundary layer and a material of the second boundary layer;

in a second step, removing at least the second boundary layer and the etching layer outside a region provided for the memory cell;

in a third step, selectively removing portions of the etching layer by a laterally effected etching attack under the second boundary layer, to form of the etching layer a residual portion above the channel region between the source region and the drain region;

in a fourth step, filling at least those regions below the second boundary layer wherein the material of the etching layer was removed with a material for a storage layer; and subsequently processing further method steps for electrically connecting the resulting memory cell.

2. The method according to claim 1, wherein the second step comprises fabricating spacer elements on the two sides of the gate electrode facing the source region and the drain region, respectively, the spacer elements defining a projected lateral extent of the three-layered layer structure, and removing the second boundary layer, the etching layer, and the first boundary layer outside a region covered by the gate electrode and the spacer elements.

3. The method according to claim 1, wherein the second step comprises fabricating spacer elements on the two sides of the gate electrode facing the source region and the drain region, respectively, the spacer elements defining a projected lateral extent of the second boundary layer, and removing the second boundary layer and the etching layer outside a region covered by the gate electrode and the spacer elements.

4. The method according to claim 1, wherein the second step comprises removing the second boundary layer and the etching layer outside a region covered by the gate electrode, and between the fourth and fifth steps, fabricating spacer elements on the two sides of the gate electrode facing the source region and the drain region, respectively.

5. The method according to claim 1, which comprises fabricating the first boundary layer from a material selected from the group consisting of $SiO_2$, zirconium silicate, and hafnium silicate, fabricating the etching layer of $Al_2O_3$, and fabricating the second boundary layer from a material selected from the group consisting of $SiO_2$, zirconium silicate, and hafnium silicate.

6. The method according to claim 5, which comprises fabricating the boundary layers of a material selected from the group consisting of zirconium silicate and hafnium silicate with an atomic layer deposition process.

* * * * *